United States Patent
Kuhmann (10) Patent No.: US 7,851,818 B2
(45) Date of Patent: Dec. 14, 2010

(54) FABRICATION OF COMPACT OPTO-ELECTRONIC COMPONENT PACKAGES

(75) Inventor: Jochen Kuhmann, Berlin (DE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 12/236,182

(22) Filed: Sep. 23, 2008

(65) Prior Publication Data

US 2009/0321760 A1     Dec. 31, 2009

Related U.S. Application Data

(60) Provisional application No. 61/076,263, filed on Jun. 27, 2008.

(51) Int. Cl.
| | |
|---|---|
| H01L 33/00 | (2010.01) |
| H01L 27/15 | (2010.01) |
| H01L 31/12 | (2010.01) |
| H01L 23/48 | (2010.01) |
| H01L 23/52 | (2010.01) |

(52) U.S. Cl. ............................ 257/98; 257/79; 257/81; 257/774

(58) Field of Classification Search .................. 257/79, 257/98, 80, 81, 82, 88, 95, 99, 105, 706, 257/704, 774

See application file for complete search history.

(56) References Cited

U.S. PATENT DOCUMENTS

| | | | |
|---|---|---|---|
| 6,531,328 B1 | 3/2003 | Chen | |
| 6,818,464 B2 * | 11/2004 | Heschel | ........................ 438/22 |
| 2003/0071272 A1 | 4/2003 | Faska et al. | |
| 2004/0089948 A1 | 5/2004 | Cheng et al. | |
| 2005/0269688 A1 | 12/2005 | Shiv | |
| 2006/0210234 A1 | 9/2006 | Shiv et al. | |

FOREIGN PATENT DOCUMENTS

EP         1 848 042         10/2007

(Continued)

OTHER PUBLICATIONS

TSLP-3-1 (SC101)—Infineon Technologies, "TSLP/TSSLP—package Type TSLP-3-1 (SC101)" retrieved on Nov. 15, 2007 from the Internet <URL:www.infineon.com (2 pages).

(Continued)

*Primary Examiner*—Chuong A. Luu
(74) *Attorney, Agent, or Firm*—Haynes and Boone, LLP (57) ABSTRACT

A wafer-level method of fabricating an opto-electronic component package, in which the opto-electronic component is mounted to a semiconductor wafer having first and second surfaces on opposite sides of the wafer. The method includes etching vias in the first surface of the semiconductor wafer. The first surface and surfaces in the vias are metallized, and the metal is structured to define a thermal pad and to define the anode and cathode contact pads. A carrier wafer is attached on the side of the semiconductor wafer having the first surface, and the semiconductor wafer is thinned from its second surface to expose the metallization in the vias. Metal is provided on the second surface, and the metal is structured to define a die attach pad and additional anode and cathode pads for the opto-electronic component. The opto-electronic component is mounted on the die attach pad and a protective cover is formed over the opto-electronic component.

5 Claims, 10 Drawing Sheets

FOREIGN PATENT DOCUMENTS

| | | |
|---|---|---|
| WO | WO 02/058233 A1 | 7/2002 |
| WO | WO 03/070624 A2 | 8/2003 |
| WO | 2008/087578 | 7/2008 |

OTHER PUBLICATIONS

Stratedge, Hermetic SMT, StratEdge 2004, retrieved on Nov. 15, 2007 from the Internet:<URL:www.stratedge.com/hermetic.htm (1 page).

Technology Review, "Filters and Tuners," Avnet Electronics Marketing—Leveraging Core Technologies, Oct. 2007, vol. 13, issue 10, retrieved on Nov. 15, 2007 from the Internet: <www.em.avnet.com (2 pages).

U.S. Appl. No. 12/014,443 entitled "Fabrication of Compact Semiconductor Packages."

* cited by examiner

FABRICATION OF COMPACT OPTO-ELECTRONIC COMPONENT PACKAGES

CROSS-REFERENCE TO RELATED APPLICATION(S)

This application claims the benefit of priority of U.S. Provisional Patent Application 61/076,263, filed on Jun. 27, 2008, the contents of which are incorporated by reference in its entirety.

TECHNICAL FIELD

This invention relates to opto-electronic component packages.

BACKGROUND

The use of light emitting diodes (LEDs) in electronic products is ever-increasing and in some cases are replacing traditional light sources, such as light bulbs, in existing applications. For example, LEDs can now be found in flashlights, automotive headlights and backlight units for LCD screens.

Ceramics such as alumina oxide ($Al_2O_3$) or aluminum nitride (AlN) are used in the packaging of high brightness LEDs. In addition to ceramics, plastic leadless chip carriers ("PLCC") and other leadframe configurations are also used. These types of packages often have large footprints, poor thermal conductivity and large mechanical tolerances and are not flexible to design changes, thus making application-specific designs difficult.

As features and capabilities of consumer electronic products grow, there is an increasing need to fit more circuit elements (e.g., electrical circuit components, integrated circuit dies, LEDs, thermistors, diodes, rectifiers, temperature sensors, and LED drivers) in a smaller space. Typically, the dimensions of a printed circuit board (PCB) are dictated by the size of the consumer electronic product and the available space within the product. For example, in some consumer electronics such as mobile phones or other handheld products, the height of an assembled PCB (e.g., the circuit elements mounted on both sides of the PCB) is limited to be about one millimeter (mm), whereas the typical height of the assembled PCB is 1.5 mm (a typical height of a PCB is 500 microns (μm) and a typical height of circuit elements is 500 μm). Therefore, either the size of the assembled PCB must be reduced or features and capabilities must be reduced to fit the assembled PCB into the limited available space. In addition, thermal performance of the circuit elements is also a consideration.

SUMMARY

Techniques are disclosed for fabricating an opto-electronic component package in which the opto-electronic component is mounted to a semiconductor wafer. The packages can be fabricated, for example, in a wafer-level batch process.

Fabrication techniques are disclosed for an opto-electronic component package in which the opto-electronic component is mounted to a semiconductor wafer having first and second surfaces on opposite sides of the wafer. The first surface includes anode and cathode contact pads electrically connected to the opto-electronic component which is mounted to the side of the semiconductor wafer having the second surface.

In one aspect, the method includes etching vias in the first surface of the semiconductor wafer. The vias extend partially through the semiconductor wafer. Metal is provided on the first surface of the semiconductor wafer and surfaces in the vias. The metal is structured to define a thermal pad for heat transfer away from the opto-electronic component and to define the anode and cathode contact pads electrically connected to metallization in the vias.

A carrier wafer is attached on the side of the semiconductor wafer having the first surface, and the semiconductor wafer is thinned from its second surface to expose the metallization in the vias. Metal is provided on the second surface of the semiconductor wafer and structured to define a die attach pad and to define additional anode and cathode pads for the opto-electronic component. The additional anode and cathode pads are electrically connected to metallization in the vias, and the opto-electronic component is mounted on the die attach pad. A protective cover that is transparent to a wavelength of light emitted by or received by the opto-electronic component is formed over the opto-electronic component.

Some implementations result in smaller or thinner packages that provide better thermal isolation or performance and can provide for greater design flexibility which allows for changes to the design to be easily incorporated into a manufacturing process. In addition, various modifications to the process can be made such that the process can be used with a LED or other opto-electronic component package with an integrated electronic circuit structure.

The details of one or more embodiments of the invention are described in the accompanying drawings and the description below.

Other features and advantages will be apparent from the detailed description and drawings, and from the claims.

DETAILED DESCRIPTION

Figure 1A:
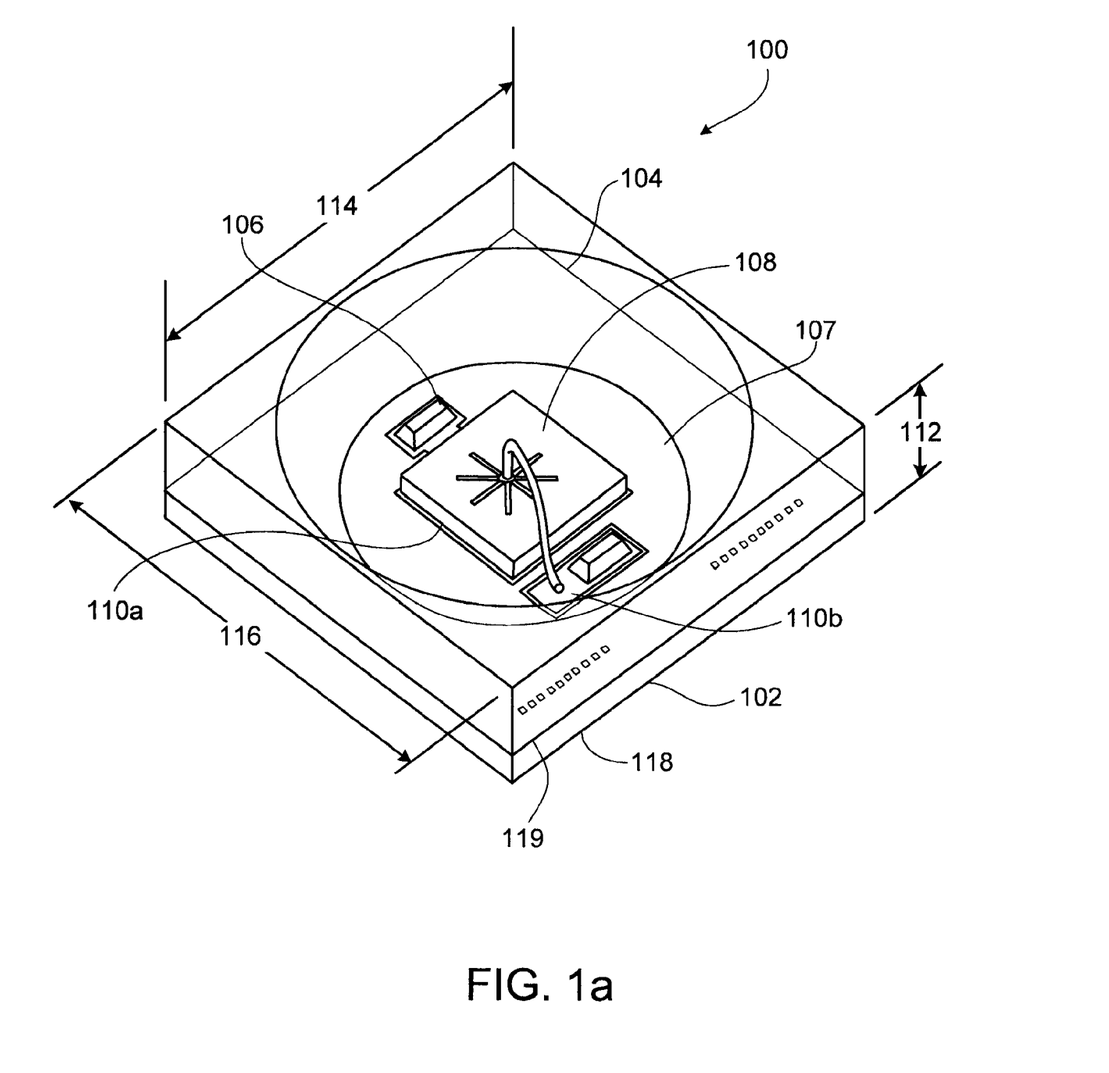
FIG. 1a is an example of a LED package.
Figure 1B:
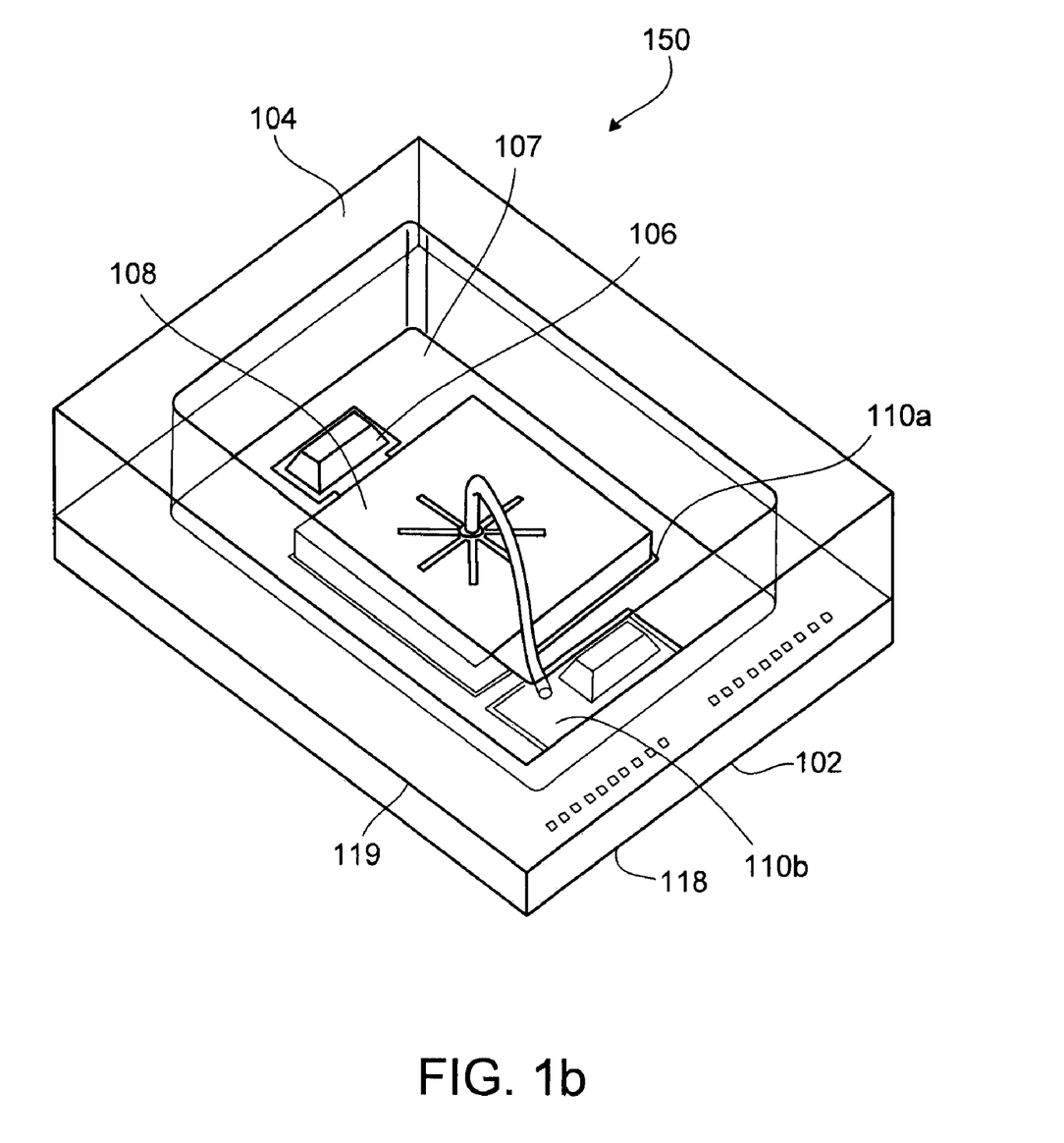
FIG. 1b is a second example of a LED package.

FIGS. 1a and 1b illustrate examples of thin LED packages 100 and 150 with enhanced thermal performance 100 and 150. Although FIGS. 1a and 1b are described with respect to a LED 108, the LED 108 can be replaced with other types of opto-electronic components. For example, in some implementations, the LED 108 is replaced by an infra-red emitter (e.g., a vertical-cavity surface-emitting laser), an infra-red receiver (e.g., a pin diode) or an infra-red transceiver. Likewise, the fabrication processes described below can be used to make packages for opto-electronic components other than LEDs.

The LED package 100 includes a base 102, a reflector 104, feed-through metallization 106, a reflective surface 107, an LED 108, a LED die attach pad 110a (located underneath the LED 108) and wirebond pads 110b. In the illustrated example, the base 102 is formed from a silicon or other semiconductor wafer. The physical dimensions (e.g., the height 112, the width 114 and the depth 116) of the LED package 100 may vary depending on the size of the LED, the application, or the intended use of the LED package. An example package 100 has a height 112 equal to about 550 µm, a width 114 equal to about 3100 µm and a depth 116 equal to about 3100 µm. The height 112 includes the height of the reflector 104 and the height of the base 102. For example, the height of the reflector 104 can be 400 µm and the height of the base 102 can be 150 µm. The physical dimensions can be increased or decreased to accommodate different size opto-electronic components 108 or based on the intended use of the LED package 100. For example, the base 102 can have a height from 100 µm to 400 µm.

The base 102 contains one or more vias with feed-through metallization 106 that extends from the surface-mount-device (SMD) side 118 of the base (i.e., the side of the base 102 that is to be mounted to a PCB). The feed-through metallization 106 in each of the vias protrudes from the LED side 119 of the base (i.e., the side of the base 102 that the LED 108 is mounted to and opposite the SMD side 118) and is used to form electrical interconnections between the PCB and the LED package 100. The number of vias with feed-through metallization 106 is typically two, but can be increased depending on the number of LEDs 108 that are mounted on the base 102. For example, an array of LEDS 108 may be placed on the base 102.

The base 102 includes the reflective surface 107, which can be a thin layer of metal such as aluminum, silver, or some other reflective material. Although FIG. 1a illustrates the LED package 100 with a single circular reflective surface 107, the base 102 can have multiple reflective surfaces 107 and is not limited to circular geometries. For example, FIG. 1b illustrates a rectangular reflective surface 107. The reflective surface 107 enables enhanced light output efficiency and helps direct the light out of the LED package.

The reflector 104 can be used to increase the light directed out of the LED package 100. The reflector 104 can be, for example, a plastic molded structure with round parabolic walls or vertical walls. The reflector 104 can have different geometries depending on the application of the LED package 100. For example, in some implementations, the reflector 104 has a round parabolic wall as illustrated in FIG. 1a. The slope of the parabolic wall can be 45 degrees or any other angle depending on the application of the LED package 100. In other implementations, the reflector 104 does not have a parabolic wall. For example, FIG. 1b illustrates a reflector 104 with vertical walls, sometimes referred to as a cavity substrate.

The reflector 104 also can be used as a stand-off for optical components. For example, a lens for beam shaping can be mounted to the top of the reflector 104.

Figure 1C:
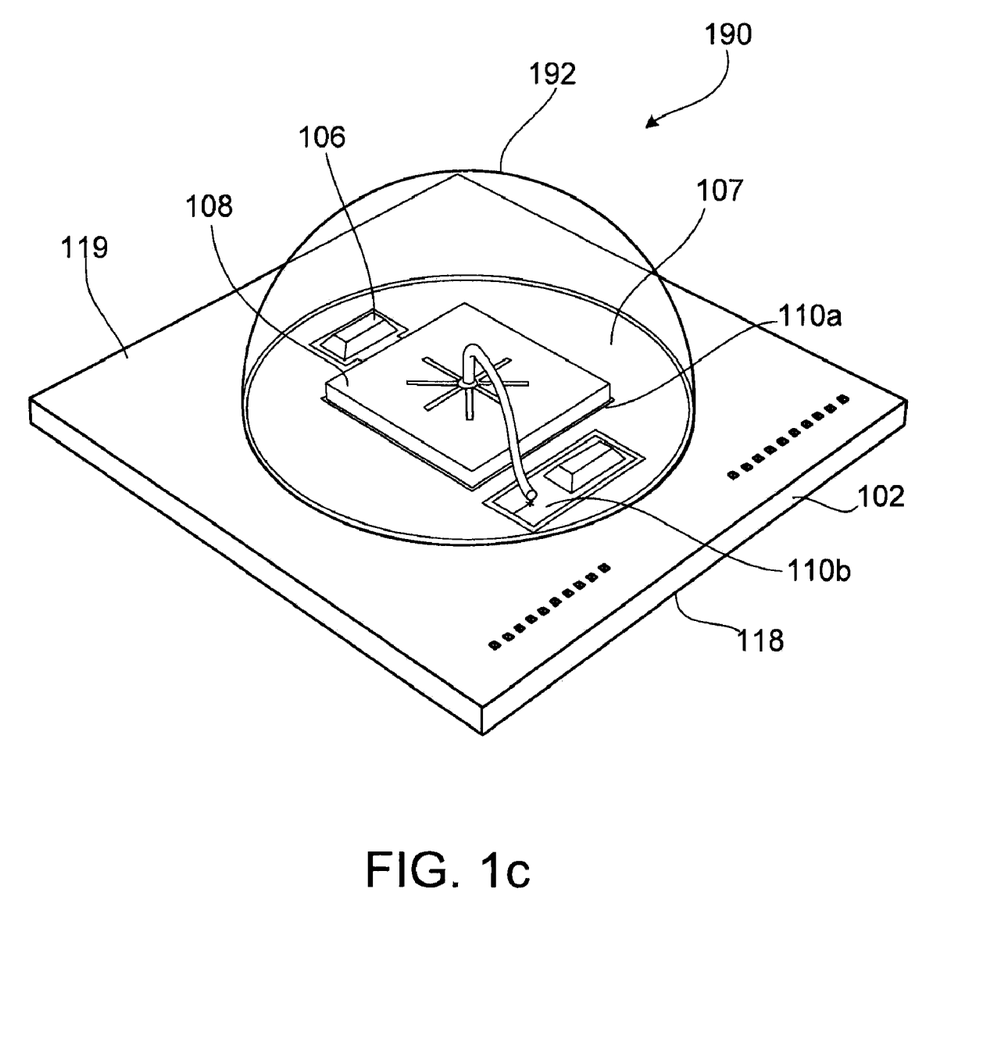
FIG. 1c is a third example of a LED package.

Although the LED packages 100 and 150 both include a reflector 104, in some implementations, the reflector 104 is omitted. For example, FIG. 1c is an example LED package 190 where the reflector 104 is omitted. Instead of a reflector, the LED package 190 includes a lens 192 that is attached to the LED side 119 of the base and covers the LED 108. In some implementations, the lens 192 can be used to focus the light emitted from the LED package 190 or to enhance the light output of the LED package 190.

The LED 108 is mounted to the base 102 by the LED die attach pad 110a located underneath the LED 108. The LED die attach pad 110a is formed on the LED side 119 of the base and can be connected to electrical ground. The LED 108 also can be electrically connected to the wirebond pads 110b, also referred to as anode and cathode pads. Thus, anode and cathode pads 110b are provided near the die attach pads 110a. In some implementations, the die attach pad 110a can act as the electrical ground electrode and the wirebond pads 110b form a contact only to the cathode of the LED 108.

Figure 2:
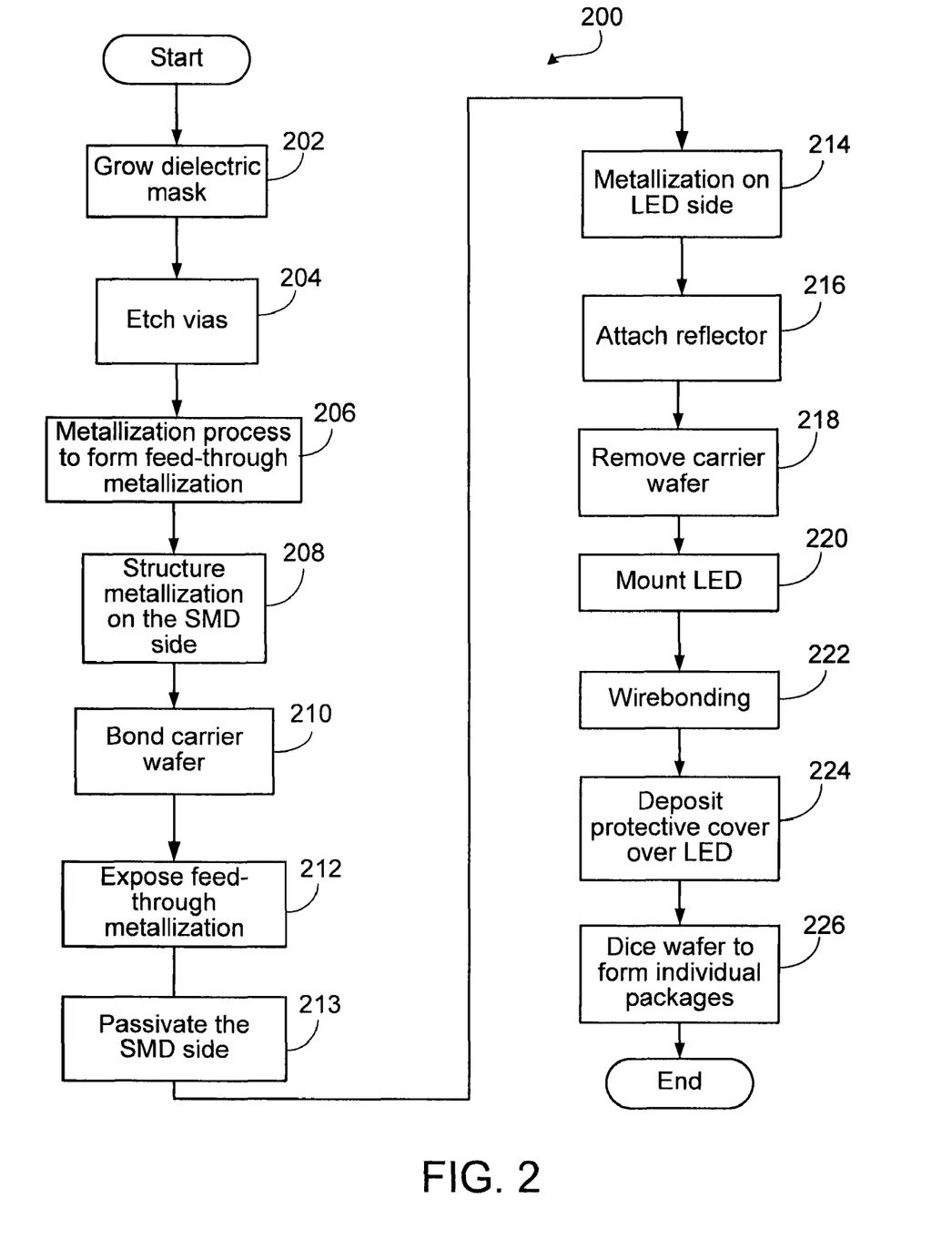
FIG. 2 is a flowchart illustrating an example of a process to form a thin LED package.
Figure 3:
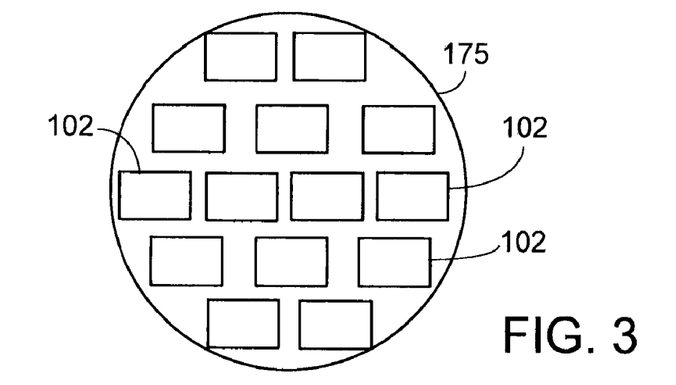
FIG. 3 is an illustration of a semiconductor wafer.

FIG. 2 is a flowchart illustrating a wafer-level process 200 to form the LED package 100 or 150. The process 200 is typically performed on a silicon or other semiconductor wafer to define multiple bases 102 for individual, discrete packages. An example of a semiconductor wafer 175 with areas defining multiple bases 102 is shown in FIG. 3. Although the fabrication process can be performed at the wafer level, for ease of discussion and illustration, the individual steps of process 200 are described below as being performed with respect to a section of the semiconductor wafer 175 defining a single base 102.

Figure 4:
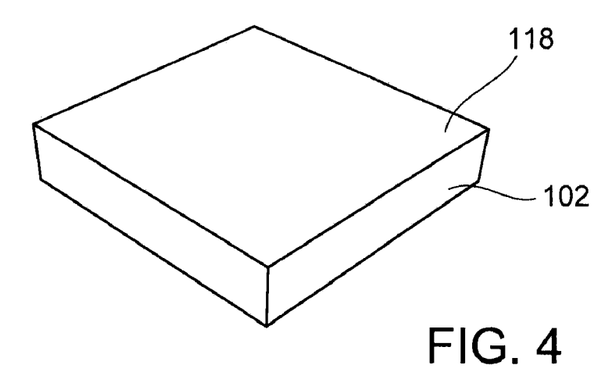
FIG. 4 is an illustration of a base.
Figure 5:
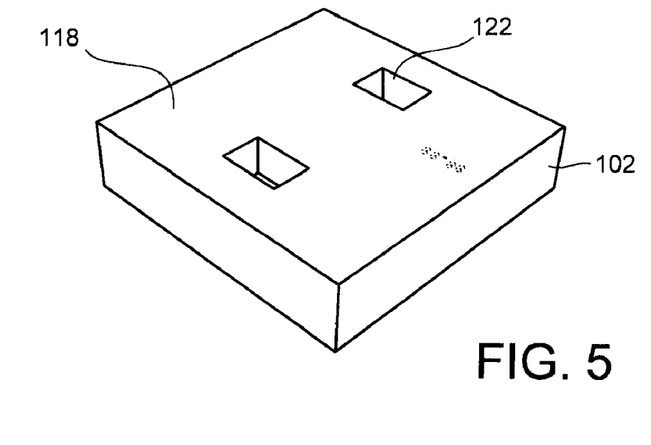
FIG. 5 is an illustration of a base with vias.

The process 200 begins with a silicon or other semiconductor wafer having a thickness, for example, of 650 µm. FIG. 4 illustrates a section of the wafer 175 defining a single base 102 before any processing has occurred. A dielectric mask, such as silicon dioxide ($SiO_2$) or silicon nitride ($Si_xN_y$), is grown on the base 102 (block 202). The vias 122 then are etched into the SMD side 118 of the base (block 204). The vias 122 can be etched using a wet etching technique such as potassium hydroxide (KOH) etching or tetramethyl ammonium hydroxide (TMAH) etching. Alternatively, the vias 122 can be etched using a dry etching technique. The vias 122 can be etched to any desired depth, so long as they do not penetrate the bottom of the base 102 (i.e., the vias 122 remain buried). FIG. 5 illustrates the base 102 after the vias 122 are etched. The SMD side 118 of the base and the vias 122 then undergo an oxidation process. For example, $SiO_2$ can be grown on the SMD side 118, in the vias 122 and on the LED side 119 of the base.

The SMD side 118 of the base and the vias 122 undergo a metallization process that forms the feed-through metallization 106 (block 206). The feed-through metallization 106 can be formed, for example, by the deposition of conductive metals in the vias 122. Metals such as chromium, titanium, gold, copper, nickel, aluminum, and silver are deposited on predetermined portions of the SMD side 118 of the base and the vias 122, and one or more layers of metals can be deposited (i.e., a metal stack). For example, in some implementations, metal is deposited on the entire surface of the SMD side 118 of the base and in the vias 122. In other embodiments, metal can be selectively deposited in the vias 122 and in areas around the corners of the SMD side 118 of the base.

Figure 6:
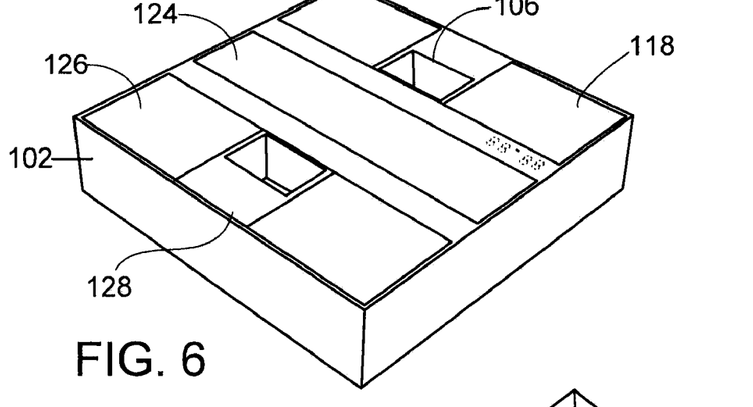
FIG. 6 is an illustration of the SMD side of the base after a metallization process.

As shown in FIG. 6, the SMD side 118 of the base then is processed (i.e., structured) to create a thermal pad 124 and electrical contact pads 126 (block 208). The SMD side 118 is processed by removing predetermined portions of the metal deposited on the SMD side 118. The metal can be selectively removed to form the thermal pad 124 and the contact pads 126 by applying a mask and using a known etching technique. For example, a wet etching technique or a dry etching technique can be used. The thermal pad 124 is electrically insulated from the electrical contact pads 126. The thermal pad 124 allows for efficient heat transfer from the LED 108 to the surface on which the package 100 is mounted (e.g., a PCB). The contact pads 126 serve as anode or cathode contact pads that allow the LED package 100 to make electrical connections through the feed-through metallization to the PCB. FIG. 6 is an illustration of the SMD side 118 of the base after it has been structured and the thermal pad 124 and the electrical contact pads 126 have been formed. Although FIG. 6 illustrates a single thermal pad 124, the SMD side 118 of the base can include multiple thermal pads 124. For example, if multiple LEDs or an array of LEDs are contained in the package, then the SMD side 118 of the base can include multiple thermal pads 124.

In addition to forming the thermal pad 124 and the electrical contact pads 126, the SMD side 118 of the base can be processed to form solder dams 128 in the areas around the feed-through metallization 106. For example, the solder dams 128 can be formed by depositing a mask on the SMD side 118 of the base and selectively removing portions of the metal stack to expose a layer of the metal stack that is not wettable by solder. For example, metal can be removed to expose a layer of titanium. The solder dams 128 prevent solder from flowing from the electrical contact pads 126 into the feed-through metallization 106.

Figure 7:
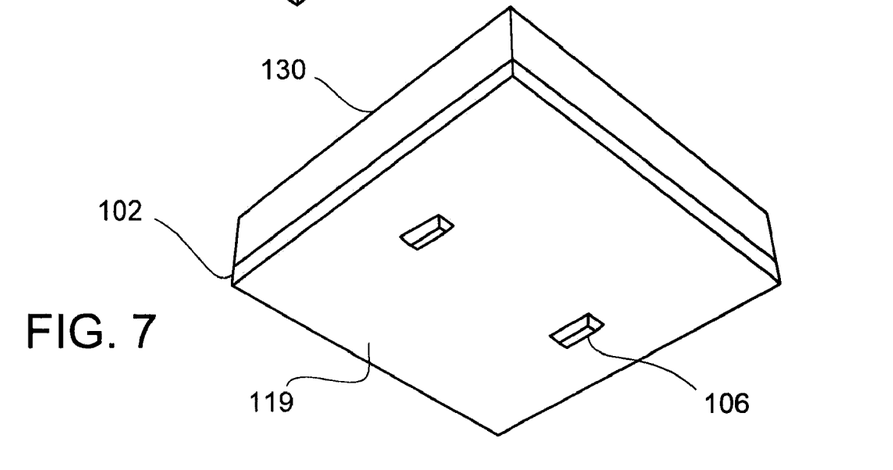
FIG. 7 is an illustration of the LED side of the base after a carrier wafer has been attached.

As shown in FIG. 7, a carrier wafer 130 then is bonded to the SMD side 118 of the wafer being provided (block 210). The carrier wafer 130 can be, for example, a silicon wafer, a glass wafer, or a wafer of some other material. The carrier wafer 130 can be bonded to the base 102, for example, with an adhesive bonding process or some other type of non-permanent bonding process.

After the carrier wafer 130 is attached, the LED side 119 of the base is processed to expose the feed-through metallization 106 in the vias 122 (block 212). A mechanical grinding technique can be used to reduce the thickness of the base 102 from the LED side 119 of the base 102. The base 102 is supported by the carrier wafer 130 for mechanical stability during the grinding process and subsequent processing steps. In some implementations, the base 102 is thinned until its thickness is approximately 210 μm. The LED side 119 of the base 102 then is dry-etched to open the feed-through metallization 106. For example, the base 102 can be dry-etched using a reactive ion etching (RIE) process. In some implementations, the RIE process removes approximately 60 μm to open the feed-through metallization 106. As the base 102 is made from silicon and the vias 122 are metallized and protected by the layer of dielectric material deposited by the oxidation process performed in block 204, the material of the base 102 is removed at a faster rate than the dielectric coating of the vias 122. As shown in FIG. 7, this difference in etching rates results in the feed-through metallization 106 being exposed and protruding slightly beyond the SMD side 118 of the base.

A dielectric mask is then deposited on the SMD side 118 of the base to provide electrical insulation (block 213). In some implementations, the dielectric mask can be deposited by a plasma-enhanced chemical vapor deposition (PE-CVD) process. The feed-through metallization 106 is then opened by removing the dielectric coating from the feed-through metallization 106. The dielectric coating can be removed by applying a mask such as a photoresist and etching the dielectric coating covering the feed-through metallization 106. A wet etching technique or a dry etching technique can be used. Other techniques to expose the feed-through metallization may be used.

Figure 8:
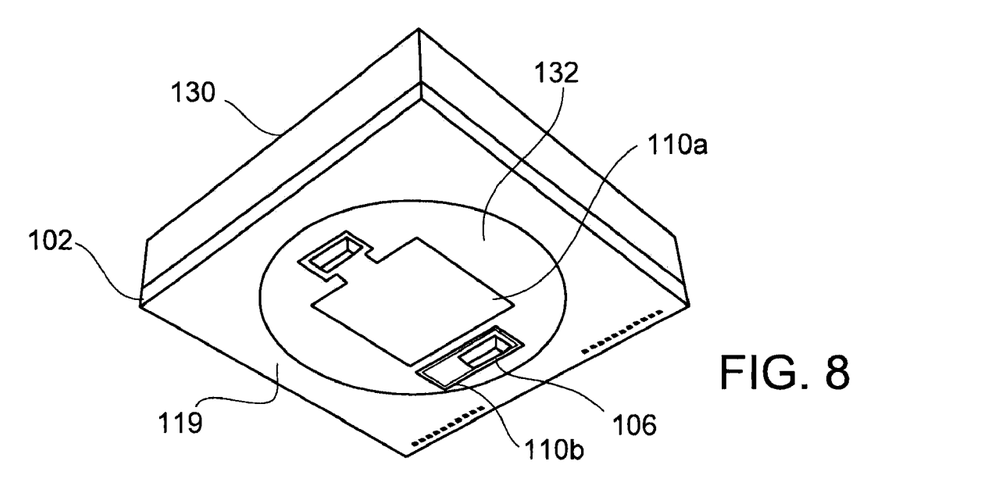
FIG. 8 is an illustration of the LED side of the base after a metallization process.

Metal is then deposited on the LED side 119 of the base 102 (block 214) to form electrical connections with the feed-through metallization 106 and the anode and cathode pads 110b and the reflective surface 107. The anode and cathode pads 110b and the reflective surface 107 can be formed by applying a photoresist mask and using a wet or dry etching process. A metal such as titanium, chromium, aluminum, nickel, copper, silver, gold or some combination of these metals can be used to form the LED die attach pad 110a, the pads 110b and the reflective surface 107. The amount and thickness of the metal deposited varies with the type of metal deposited. For example, in some implementations, titanium is used as the metal and is deposited so that the titanium layer has a thickness of about 100 nm. In other implementation, gold is used as the metal and is deposited so that the thickness of the gold layer is approximately 1000 nm. The metal can be deposited using a thin film metallization process such as a sputter deposition process and using a gold finish for the LED die attach pad 110a and the wirebond pads 110b. In other implementations, the metals can be deposited using electroplating techniques. The metal can be selectively removed by applying a mask and using known wet or dry etching techniques. In some implementations, the anode and cathode pads 110b can be electrically connected to the feed-through metallization 106. FIG. 8 is an illustration of the SMD side 118 of the base after the LED die attach pad 110a, the pads 110b and the reflective surface 107 are formed.

The reflector 104 is aligned on the LED side of the base 102 and then attached to the base 102 (block 216). The reflector 104 may be attached to the base 102, for example, using an adhesive bonding process or by transfer or compression molding. The reflector 104 is positioned on the base 102 so that the reflective surface 107, the LED die attach pad 110a and the pad 110b are within the cavity defined by the reflector 104. In some implementations, a cavity substrate is attached instead of a reflector with round parabolic walls. The cavity substrate can be made from a polymer and attached to base 102, for example, using an adhesive bonding process or by transfer or compression molding.

After the reflector 104 is attached to the base 102, the carrier wafer 130 is removed from the SMD side 118 of the base (block 218). An LED 108 or other opto-electronic component then is mounted on the LED die attach pad 110a (block 220). The LED 108 can be mounted on the LED die attach pad 110a using an adhesive bonding process or some other mounting process such as a gold-tin (AuSn) bonding process. The LED 108 is then electrically connected to the anode and cathode pads 100b. In some implementations, thin wires are then attached to the LED 108 and the anode and cathode pads 110b (i.e., wirebonding) (block 222). For example, thin wires can be used to connect the anode and/or cathode of the LED 108 to the pads 110b. In other implementations, the LED 108 can be electrically connected to the anode and cathode pads 110b by flip-chip bonding.

After the wirebonding is completed, a protective cover or film is deposited on the LED 108 (block 224). Various types of protective covers can be used, but the protective covers should be transparent to the wavelength of light emitted by the LED 108. In implementations where the LED 108 is replaced by another opto-electronic component such as an infra-red transceiver, the protective cover should be transparent to the wavelength(s) of light emitted and/or received by the opto-electronic component. For example, in some implementations, a silicone cover is applied over the LED 108. The protective cover can also be made of a material with an index of refraction that can minimize internal reflections of the LED 108. For example, a material with an index of refraction that is between the LED's index of refraction and the index of refraction of air may be chosen. In some implementations, the protective cover acts as a filter or changes the color of the light emitted from the LED 108. For example, a phosphor silicone cover can be applied to a blue LED 108 to change the color of light emitted from LED 108. In some implementations, the protective cover is omitted.

After the protective cover is deposited over the LED 108, the individual LED packages are separated by a dicing process (block 226). FIGS. 1a and 1b illustrate individual LED packages 100 and 150 after the reflector 104 has been attached to the base 102 and the carrier wafer 130 has been removed.

Various modifications may be made to the foregoing process. For example, process 200 can be modified such that the reflector 104 is not included or a lens can be molded directly on the LED side 119 of the base similar to the LED package shown in FIG. 1c. In addition, process 200 can be modified such that the carrier wafer 130 is removed from the SMD side 118 of the base after the individual thin LED packages are formed (i.e., the carrier wafer 130 is removed after the dicing process), immediately before the dicing process, prior to attaching the reflector 104, a lens 192 or a cavity substrate or before the LED die is mounted.

Figure 17:
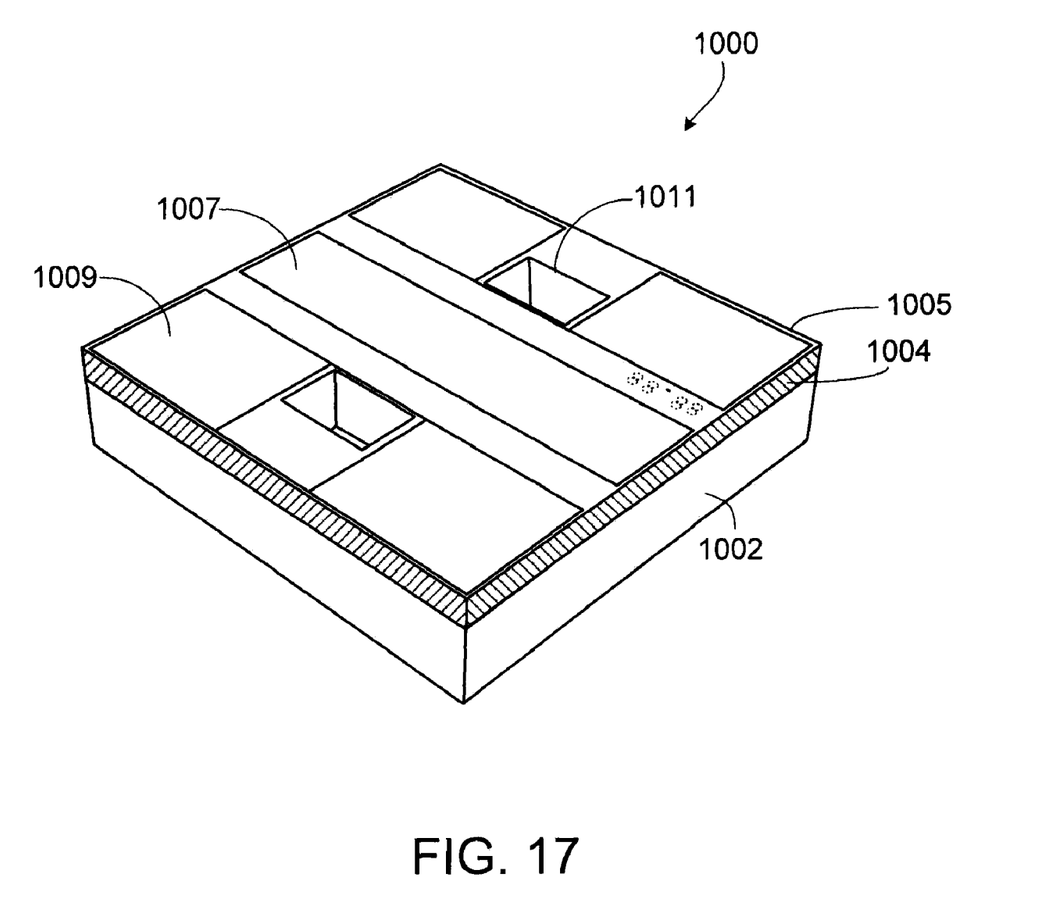
FIG. 17 is an illustration of an SMD side of the thin LED package with an integrated electronic circuit structure.

Process 200 can be further modified to form a thin LED package with an integrated electronic circuit structure made by CMOS, MOS or bipolar technology. FIG. 17 illustrates an example of the SMD side of a thin LED package 1000 with an integrated electronic circuit structure 1004 before the base 1002 is thinned. The LED package 1000 is similar to the LED packages described above in connection with process 200 and packages 100 and 150; however, the LED package 1000 includes an electronic circuit structure 1004, including electronic circuitry, integrated with the base 1002.

The electronic circuit structure 1004 contains one or more electrical circuits that are coupled electrically to the LED, to the LED package 1000 and/or to the LED driver. The electronic circuit structure 1004 can be coupled to the LED through the LED die attach pad or the wirebonding pads. Such circuits may include, for example, a LED driver circuit, an AC/DC converter, electrostatic discharge protection circuits, transient voltage suppression circuits, amplifier circuits, temperature and optical sensing circuits, control and feedback circuits. The electronic circuit structure 1004 typically includes multiple layers on the semiconductor substrate or layers that are buried in the semiconductor substrate to accommodate the electrical circuits.

The SMD side 1005 of the wafer is the surface of the electronic circuit structure 1004 that is to be mounted to a PCB and includes a thermal pad 1007, contact pads 1009 and feed-through metallization 1011. The thermal pad 1007, the contact pads 1009 and feed-through metallization 1011 are similar to the thermal pad 124, the contact pads 126 and the feed-through metallization 106 described above in connection with process 200 and the LED packages 100 and 150. However, the feed-through metallization 1011 extends from the electronic circuit structure 1004 through the base 1002 (i.e., to the other side of the semiconductor substrate).

Figure 9:
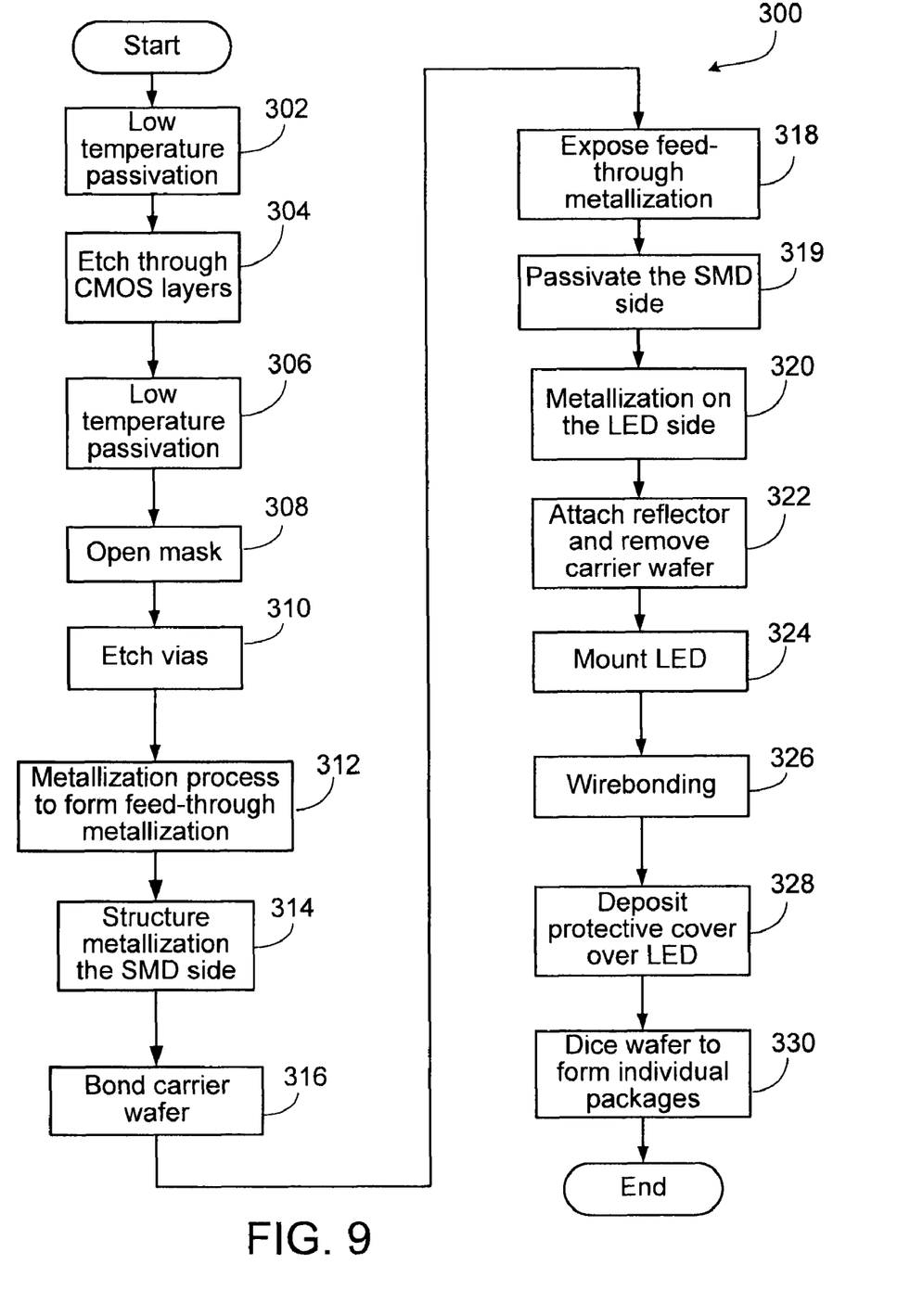
FIG. 9 is a flowchart illustrating an example of a process to form a thin LED package with an integrated electronic circuit structure.

FIG. 9 is a flowchart illustrating a wafer-level process 300 to form the thin LED package 1000 with an integrated electronic circuit structure 1004. Process 300 is typically performed on a silicon or other semiconductor wafer with the electronic circuit layers already present. For ease of discussion and illustration, the individual steps of process 300 will be described as being performed with respect to a section of the wafer defining a single base 1002. The process 300 incorporates various details to avoid damaging the electronic circuit.

Figure 10:
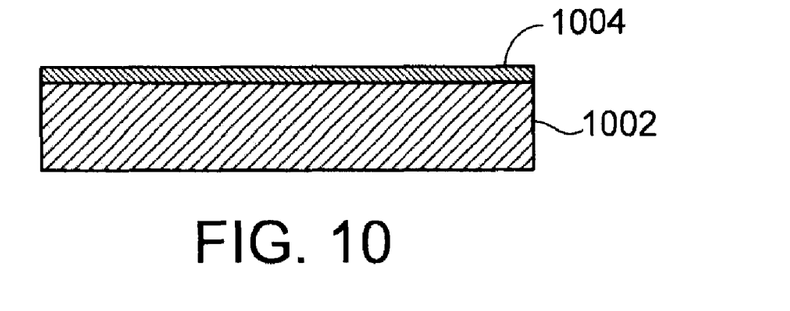
FIG. 10 is an illustration of a electronic circuit structure bonded to a base.

The process 300 begins with a silicon or other semiconductor wafer that acts as a base 1002. As shown in FIG. 10, the base 1002 includes an electronic circuit structure 1004. The electronic circuit structure 1004 undergoes a low temperature passivation process (block 302). Various types of passivation processes can be used, but the process should not affect the carriers in the electronic circuit structure 1004 or otherwise damage the electronic circuit layers. For example, a PE-CVD process can be used. As a result of the passivation process, the electronic circuit structure 1004 is covered by a thin mask 1008 such as an oxide or nitride-based mask. Other passivation processes can be applied. The mask is then opened to expose predetermined portions of the electronic circuit layers. The mask can be opened using a wet etching process or a dry etching process. The predetermined portions of the electronic circuit layers that are exposed typically correspond to areas that do not contain the electronic circuits and that correspond to the portion of the base 1002 in which vias 1010 for the feed-through metallization are formed.

Figure 11:
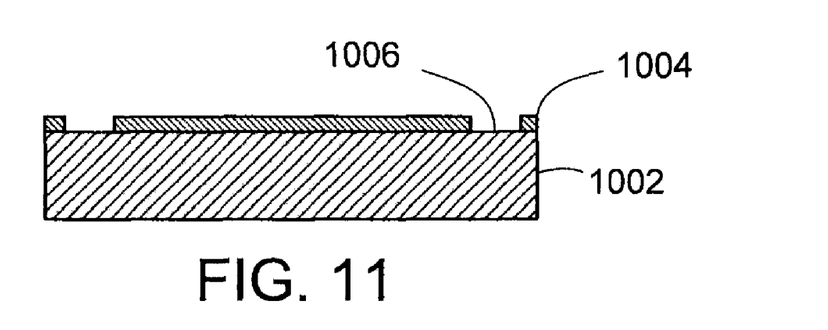
FIG. 11 is an illustration of a electronic circuit structure after predetermined portions of the electronic circuit structure have been removed.

As shown in FIG. 11, the top surface of the wafer is etched to remove the predetermined portions of the electronic circuit layers and expose portions 1006 of the surface of the base 1002 (block 304). The electronic circuit layers 1004 can be etched, for example, using a deep reactive ion etching ("DRIE") process. In implementations including electronic circuit layers 1004 that are buried in the semiconductor substrate, the electronic circuit layers 1004 can be etched using a wet etching process. The predetermined portions of the electronic circuit layers that are removed typically correspond to areas that do not contain the electrical circuit elements and that correspond to portions of the base 1002 in which vias 1010 for the feed-through metallization are to be formed. After the etching is complete, the mask is removed (i.e., stripped). FIG. 11 illustrates the electronic circuit structure 1004 after predetermined portions of the electronic circuit layers and the mask have been removed.

Figure 12:
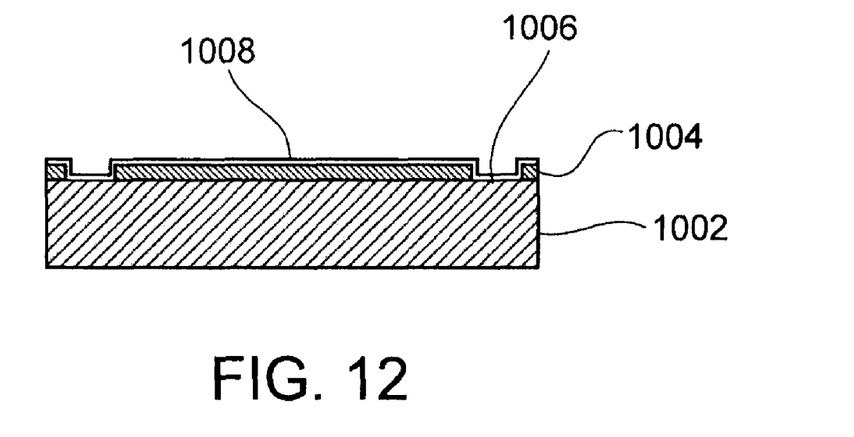
FIG. 12 is an illustration of a electronic circuit structure after undergoing a passivation process.

The electronic circuit structure 1004 and the exposed portions 1006 of the base 1002 undergo a low temperature passivation process (block 306). Similar to the passivation process described above in connection with block 302, the passivation process should not affect the electronic circuit carriers in the electronic circuit structure 1004 or otherwise damage the electronic circuit layers. For example, a PE-CVD process can be used. As a result of the passivation process, the electronic circuit structure 1004 and the exposed portions 1006 of the base 1002 are covered by a thin mask 1008 such as an oxide or nitride-based mask. FIG. 12 is an illustration of the electronic circuit structure 1004 and the exposed portions 1006 of the base 1002 covered by the mask 1008.

Figure 13:
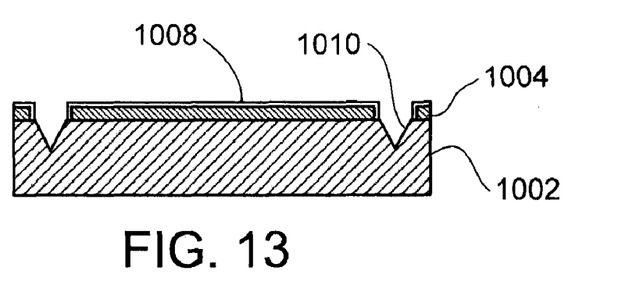
FIG. 13 is an illustration of a base after the vias are formed by an etching process.

Portions of the mask 1008 covering the surface of the base 1002 are then opened using, for example, a dry etching process, such as a RIE process (block 308). The exposed portions 1006 of the base 1002 then are etched to form vias 1010 (block 310). Various types of etching processes can be used, but the etching process should not damage the electronic circuit structure 1004 or the electrical circuits contained in the electronic circuit layers. For example, a tetramethlyammonium hydroxide (TMAH) etching process can be used to form the vias 1010. FIG. 13 is an illustration of the base 1002 after the vias 1010 are formed. The mask is stripped and the electronic circuit structure 1004 and the vias 1010 are then passivated using a PE-CVD passivation process. The passivation process deposits an oxide or nitride-based mask and provides electrical insulation.

In addition to forming the vias 1010, the exposed portions 1006 of the base 1002 are metallized to form the feed-through metallization 1011 (block 312) in a manner similar to block 206 of process 200. The exposed portions 1006 of the base 1002 also are passivated using a PE-CVD passivation process, and the SMD side 1005 of the electronic circuit structure undergoes a metallization process to form the thermal pad 1007 and electrical contact pads 1009 (block 314) similar to block 208 of process 200. In addition to forming the thermal pad 1007 and the electrical contact pads 1009, interconnecting lines and other electrical connections to be used in connection with the electronic circuit structure 1004 are formed. The thermal pad 1007 and the electrical contact pad 1009 are formed on the SMD side 1005 of the electronic circuit structure 1004.

Figure 14:
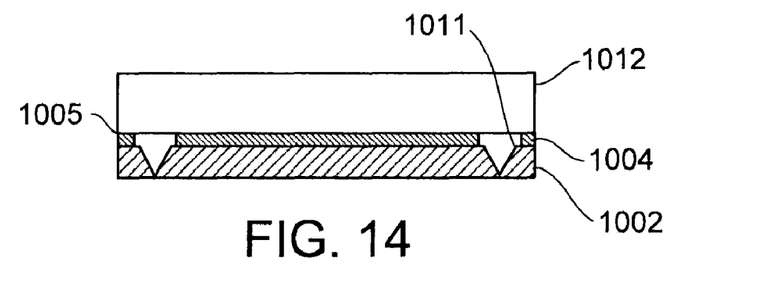
FIG. 14 is an illustration of a carrier wafer bonded to the electronic circuit structure.

As shown in FIG. 14, a carrier wafer 1012 then is bonded to the SMD side 1005 of the wafer being processed (block 316). The carrier wafer 1012 can be a silicon wafer, a glass wafer, or a wafer of some other material and can be bonded to the base 1002 with an adhesive bonding process or some other type of non-permanent bonding process.

Figure 15:
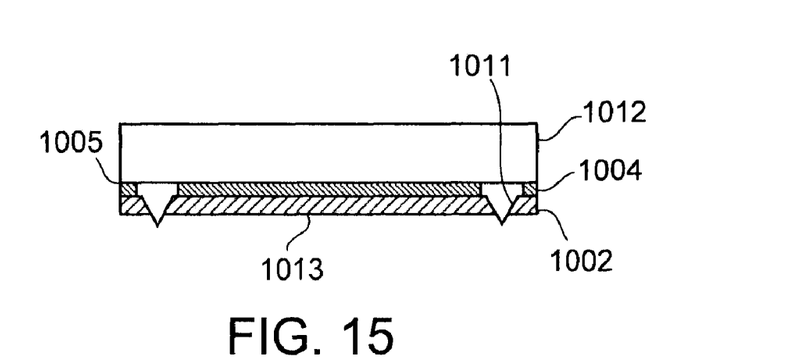
FIG. 15 is an illustration of base with the exposed feedthrough metallization.

After the carrier wafer 1012 is attached, the LED side 1013 of the base is processed to expose the feed-through metallization 1011 in the vias 1010 (block 318). A mechanical grinding technique can be used to reduce the thickness of the base 1002 from the LED side 1013 of the base 1002. The base 1002 is supported by the carrier wafer 1012 for mechanical stability during the grinding process. In some implementations, the base 1002 is thinned until its thickness is approximately 210 µm. The LED side 1013 of the base 1002 then is dry-etched to expose the feed-through metallization 106. FIG. 15 illustrates the base 1002 with the exposed feed-through metallization 1011.

The LED side 1013 is then passivated by depositing a dielectric layer on the LED side 1013 (block 319). For example, a PE-CVD process can be used to deposit the dielectric layer on the LED side 1013. A photomask is applied to the LED side 1013 and portions of the dielectric layer are selectively removed by etching the dielectric layer to open the feed-through metallization 106. A wet or dry etching process can be used to selectively remove the dielectric layer. The metal deposited in the vias 1010 to form the feed-through metallization 1011 can be used as an etch stop (i.e., the dielectric layer on the LED side 1013 is etched until the feed-through metallization 1011 is exposed). For example, in some implementations, aluminum is deposited in the vias 1010 as a first metal layer to form the feed-through metallization 1011 and the aluminum acts as the etch stop because the material of the base 1002 is removed at a faster rate than the aluminum in the feed-through metallization 1011.

Figure 16:
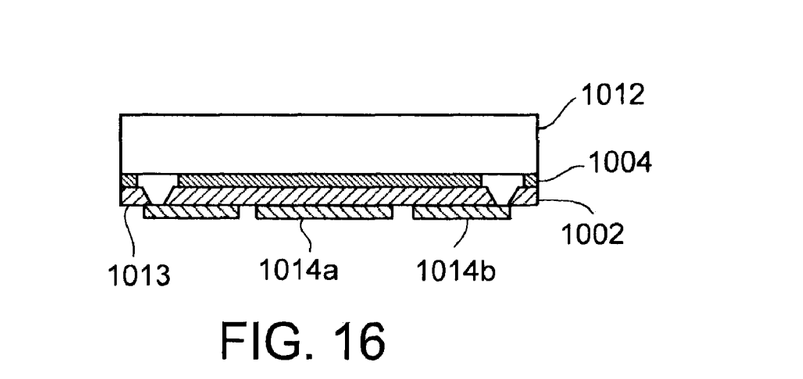
FIG. 16 is an illustration of the thin LED package with an integrated electronic circuit structure after a thermal pad and wirebonding pads have been formed.

The LED side 1013 of the base undergoes a metallization process to form the LED die attach pad 1014a, the pads 1014b for the anode and/or cathode, and the reflector (not shown) (block 320). The metallization process is similar to block 214 of process 200. FIG. 16 is an illustration of the thin LED package 1000 after LED die attach pads 1014a and the pads 1014b are formed on the LED side 1013 of the base.

As described above in connection with blocks 216 and 218 of process 200, a reflector is aligned and attached to the base 1002 and the carrier wafer 1012 is removed (block 322). The LED 108 is then attached to the LED die attach pad 1014a (block 324). The LED 108 can be mounted on the LED die attach pad 110a using an adhesive bonding process or some other mounting process. The LED 108 is then electrically connected to the anode and cathode pads 110b. In some implementations, thin wires are then attached to the LED 108 connecting the LED to the anode and cathode pads 110b (block 326). For example, thin wires can be used to connect the anode and/or cathode of the LED 108 to the wirebonding pads 110b. In other implementations, the LED 108 can be electrically connected to the anode and cathode pads 110b by flip-chip bonding As described above in connection with block 224 of process 200, a protective cover or film is deposited over the LED (block 328). After the protective cover is deposited over the LED, the individual LED packages are separated by a dicing process (block 330). As described above, the carrier substrate can be removed at various times during process 300.

The processes described above can provide advantages. For example, processes 200 and 300 allow the vias to be placed closer to the LED die attach pad which can result in thinner packages having smaller footprints than ceramic, PLCC or leadframe packages. The thin packages can also provide for better thermal isolation and performance in applications with LEDs arranged in an array configuration or with multiple LEDs. The thin packages can also provide increased optical performance due to the smaller footprints, less height and less spacing between LEDs. In addition, these processes lead to greater manufacturing flexibility allowing application-specific designs and design changes to be easily incorporated in the manufacturing process.

Other implementations are within the scope of the claims.

What is claimed is:

1. An opto-electronic component package comprising:
   a semiconductor wafer comprising first and second surfaces on opposite sides of the wafer, wherein a height of the semiconductor wafer is 100 µl to 400 µm;
   vias extending through the wafer from the first surface to the second surface, with metallization over inner surfaces of the vias;
   a thermal pad on the first surface of the wafer to transfer heat away from the opto-electronic component;
   anode and cathode contact pads on the first surface of the wafer and electrically connected to the metallization in the vias;
   a die attach pad on the second surface of the wafer;
   an opto-electronic component mounted to the die attach pad;
   anode and cathode pads on the second surface of the wafer and electrically connected to the opto-electronic component through the metallization in the vias; and
   an optical component mounted to the second surface of the wafer and arranged to direct light from the opto-electronic component out of the package.

2. The opto-electronic component package of claim 1 further comprising electronic circuitry on the first surface of the wafer and electrically connected to the opto-electronic component.

3. The opto-electronic component package of claim 1 wherein the optical component is at least one of an optical reflector or a molded lens.

4. The opto-electronic component package of claim 1 further comprising a protective cover over the opto-electronic component, wherein the protective cover is transparent to a wavelength of light emitted by or received by the opto-electronic component.

5. The opto-electronic component package of claim 1 wherein the semiconductor wafer is thinned by mechanically grinding a surface of the semiconductor wafer and etching the semiconductor wafer.

* * * * *